United States Patent [19]

Naruse et al.

[11] Patent Number: 5,289,005
[45] Date of Patent: Feb. 22, 1994

[54] ELECTRON MICROSCOPE

[75] Inventors: Mikio Naruse; Eiichi Watanabe; Toru Kasai, all of Tokyo, Japan

[73] Assignee: Jeol Ltd., Tokyo, Japan

[21] Appl. No.: 891,510

[22] Filed: May 29, 1992

[51] Int. Cl.⁵ .............................................. H01J 37/20
[52] U.S. Cl. .................................... 250/310; 250/311; 250/440.10; 250/442.11; 250/397; 250/515.1
[58] Field of Search ................... 250/310, 311, 442.11, 250/440.1, 397, 515.1

[56] References Cited

U.S. PATENT DOCUMENTS

| | | | |
|---|---|---|---|
| 3,446,960 | 5/1969 | Sciacca et al. | 250/442.11 |
| 3,745,341 | 7/1973 | Sakitani | 250/442.11 |
| 3,778,621 | 12/1973 | Mikajiri | 250/442.11 |
| 3,896,314 | 7/1975 | Nukui et al. | 250/442.11 |
| 4,596,934 | 6/1986 | Yanaka et al. | 250/442.1 |
| 4,803,356 | 2/1989 | Kumahora et al. | 250/310 |
| 4,833,330 | 5/1989 | Swann et al. | 250/442.11 |

Primary Examiner—Paul M. Dzierzynski
Assistant Examiner—Kiet T. Nguyen
Attorney, Agent, or Firm—Webb, Burden, Ziesenheim & Webb

[57] ABSTRACT

An electron microscope capable of performing accurate X-ray analysis. A specimen stage on which a specimen to be investigated is placed, is disposed between the upper and lower magnetic pole pieces of the objective lens. The specimen is irradiated with the electron beam to detect X-rays emitted from the specimen. The specimen stage consists of a light element, such as beryllium, that produces a very small amount of X-rays when irradiated with the electron beam. A metal film of a heavy element, such as gold, is deposited on the upper surface of the specimen stage. This metal film produces a large amount of X-rays when irradiated with the electron beam. The X-rays emitted from the lower magnetic pole piece are absorbed by the metal film. Consequently, the X-ray detector of the microscope detects only the X-rays produced from the specimen.

7 Claims, 2 Drawing Sheets

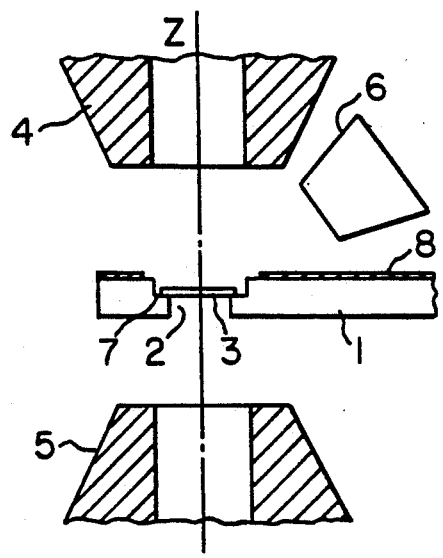
FIG. I(A)
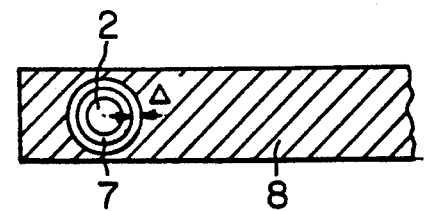
FIG. I(B)
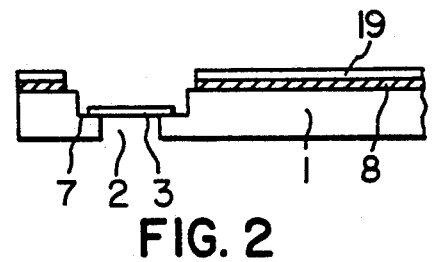
FIG. 2
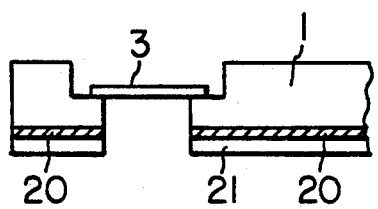
FIG. 3
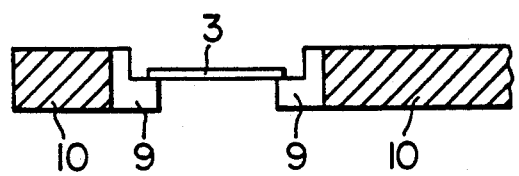
FIG. 4
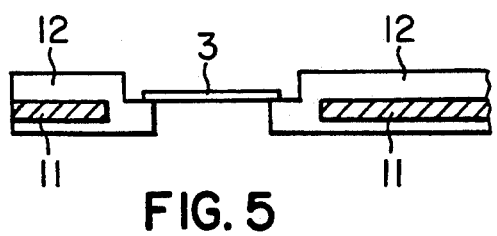
FIG. 5
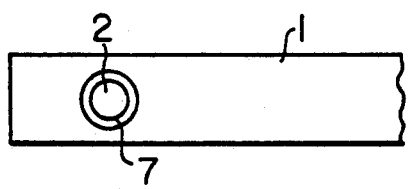
FIG. 8(B)
PRIOR ART
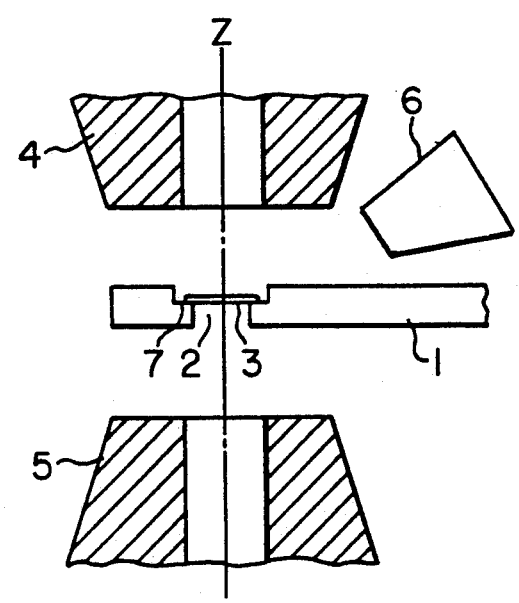
FIG. 8(A)
PRIOR ART

ELECTRON MICROSCOPE

FIELD OF THE INVENTION

The present invention relates to an electron microscope capable of performing accurate X-ray analysis.

BACKGROUND OF THE INVENTION

FIG. 8(A) schematically shows a specimen insertion device which is used with an electron microscope having X-ray analysis capability and inserts a specimen from a direction perpendicular to the optical axis Z. A specimen stage 1 has an opening 2 as shown in FIG. 8(B). The specimen, indicated by 3, is placed on the specimen-holding portion 7 of the specimen stage 1. An upper magnetic pole piece 4 and a lower magnetic pole piece 5 together form an objective lens. An X-ray detector 6 detects X-rays emitted from the specimen 3 when it is irradiated with the electron beam.

In the electron microscope of this construction, the specimen stage 1 is inserted from the direction perpendicular to the optical axis Z to observe the specimen 3. Then, the electron beam emitted by the electron gun (not shown) is directed toward the specimen 3. Electrons transmitted through the specimen 3 are magnified by lenses (not shown) located below the specimen 3. The magnified electron image is focused onto the fluorescent screen (not shown).

To make X-ray analysis of the specimen 3, the X-rays produced from the specimen 3 illuminated by the electron beam are detected by the aforementioned X-ray detector 6. The output signal from the detector 6 is sent to an X-ray analysis system (not shown), for performing the X-ray analysis.

The specimen stage 1 is generally made of a light element producing a very small amount of X-rays such as beryllium to reduce the X-ray emission from the specimen stage 1 in response to the illumination of the electron beam when the beam produced by the electron gun (not shown) leaks around the specimen-holding portion 7 of the stage 1. Therefore, most of the X-rays detected by the x-ray detector 6 are released from the specimen. Hence, the x-ray analysis can be performed accurately.

To improve the resolution of the electron microscope, the gap between the pole pieces 4 and 5 is made very small. Consequently, the specimen stage 1 is made very thin. An electron microscope having such thin specimen stage is disclosed in U.S. Pat. No. 4,596,934. While the primary electrons are penetrating the specimen 3, the electrons are scattered. Some of the scattered electrons collide against the lower magnetic pole piece 5, so that X-rays are produced from this pole piece.

Since the specimen stage is made of a light element and thin as described above, the X-rays emanating from the lower pole piece penetrate the specimen stage 1. The X-rays transmitted through the stage 1 are detected by the X-ray detector 6 in the same way as the X-rays emitted form the specimen. In consequence, it is impossible to make accurate X-ray analysis of the specimen.

SUMMARY OF THE INVENTION

It is an object of the present invention to provide an electron microscope which prevents the X-rays emitted from the lower magnetic pole piece bombarded with scattering electrons from being detected by the X-ray detector, thus permitting accurate X-ray analysis.

A first embodiment of the invention lies in an electron microscope comprising an objective lens consisting of upper and lower magnetic pole pieces, a specimen stage which is disposed between the magnetic pole pieces and on which a specimen is placed, means for directing an electron beam to the specimen to emit X-rays from the specimen, and a detection means for detecting the X-rays emitted from the specimen. The stage is composed of plural layers, one of which consists of a heavy element, another layer consisting of a light element.

A second embodiment of the invention lies in an electron microscope comprising an objective lens consisting of upper and lower magnetic pole pieces, a specimen stage which is disposed between the magnetic pole pieces and on which a specimen is placed, means for directing an electron beam to the specimen to emit X-rays from the specimen, and a detection means for detecting the X-rays emitted from the specimen. The portion of the specimen stage that is irradiated with the electron beam consists of a light element while the remaining portion of the stage consists of a heavy element.

A third embodiment of the invention lies in an electron microscope comprising an objective lens consisting of upper and lower magnetic pole pieces, a specimen stage which is disposed between the magnetic pole pieces and on which a specimen is placed, an attaching means for attaching the specimen to the specimen stage via a spacer, means for directing an electron beam to the specimen to emit X-rays from the specimen, and a detection means for detecting the X-rays emitted from the specimen. The portion of the spacer that is in contact with the specimen consists of a heavy element.

A fourth embodiment of the invention lies in an electron microscope comprising an objective lens consisting of upper and lower magnetic pole pieces, a specimen stage which is disposed between the upper and lower magnetic pole pieces and on which a specimen is placed, a cover that covers the surface of the specimen stage and is composed of plural layers, means for directing an electron beam to the specimen to emit X-rays from the specimen, and a detection means for detecting the X-rays emitted from the specimen. One of the layers of the cover consists of a heavy element, another layer consisting of a light element.

A fifth embodiment of the invention lies in an electron microscope comprising an objective lens consisting of upper and lower magnetic pole pieces, a specimen stage which is disposed between the magnetic pole pieces and on which a specimen is placed, means for directing an electron beam to the specimen to emit X-rays from the specimen, and a detection means for detecting the X-rays emitted from the specimen. A cover is provided that covers the surface of the specimen stage except for the portion irradiated with the electron beam and consists of a heavy element.

Other objects and features of the invention will become obvious upon an understanding of the illustrative embodiments about to be described or will be indicated in the appended claims, and various advantages not referred to herein will occur to one skilled in the art upon employment of the invention in practice.

BRIEF DESCRIPTION OF THE DRAWINGS

FIG. 1(A) is a vertical cross section of the main portion of an electron microscope according to the invention;

FIG. 1(B) is a horizontal cross section of the specimen stage shown in FIG. 1(A);

FIG. 2 is a side elevation of the main portion of another electron microscope according to the invention;

FIG. 3 is a side elevation of the main portion of a further electron microscope according to the invention;

FIG. 4 is a side elevation of the main portion of still another electron microscope according to the invention;

FIG. 5 is a side elevation of the main portion of yet another electron microscope according to the invention;

FIG. 8(A) is a vertical cross section of the main portion of the prior art electron microscope; and FIG. 8(B) is a horizontal cross section of the specimen stage shown in FIG. 8(A).

DETAILED DESCRIPTION OF THE INVENTION

Figure 6:
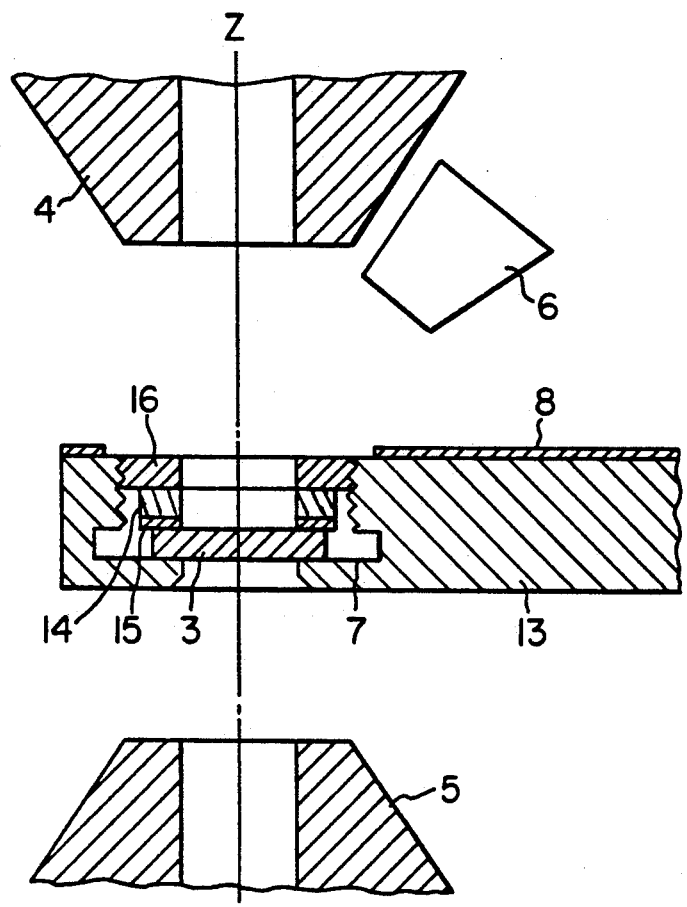
FIG. 6 is a vertical cross section of the main portion of an additional electron microscope according to the invention.

FIG. 1(A) shows a specimen insertion device which forms the main portion of an electron microscope according to the present invention. This device inserts a specimen from a direction perpendicular to the optical axis Z. It is to be noted that like components are indicated by reference numerals in various figures including FIG. 8 already used. A metal film 8 consisting of a heavy element, such as gold, is deposited on the upper surface of a specimen stage 1. This film absorbs X-rays at a quite high efficiency. The stage 1 is made of a light element. Since the metal film 8 produces a much greater amount of X-rays than the specimen stage 1, the film 8 emits a large amount of X-rays when irradiated with an electron beam. The metal film 8 of the heavy element deposited on the specimen stage 1 is spaced a distance Δ from the periphery of the specimen-holding portion 7, as shown in FIG. 1(B), in order to prevent the electron beam from leaking around the specimen-holding portion 7 of the specimen stage 1; otherwise, the leaking electrons would impinge on portions of the metal film 8.

In the electron microscope constructed in this way, when the electron beam emitted by the electron gun (not shown) is directed toward the specimen 3, X-rays are produced from the specimen 3. The resulting X-rays are detected by an X-ray detector 6.

The electrons transmitted through the specimen 3 are scattered, and some of them collide against the lower magnetic pole piece 5. X-rays are emitted from this lower magnetic pole piece 5 and fall on the specimen stage 1 made of a light element. Since the metal film 8 of the heavy element is deposited on the upper surface of this stage 1, the X-rays released from the pole piece 5 are absorbed by the metal film 8. Consequently, the X-rays produced from the lower magnetic pole piece 5 are not detected by the X-ray detector 6, which detects only the X-rays emitted from the specimen 3.

In response to irradiation of the primary electrons to the specimen, reflected electrons and other electrons are produced from the specimen. If such reflected electrons collide against the metal film 8 of the heavy element deposited on the upper surface of the specimen stage, then X-rays are generated from the film. The generation of the X-rays can be prevented by depositing a metal film 19 of a light element on the upper surface of the metal film 8 of the heavy element as shown in FIG. 2, because the reflected electrons and other electrons are absorbed by the metal film 19 of the light element.

In the above description, the metal film 8 of the heavy element is deposited on the upper surface of the specimen stage 1. The same advantage can be obtained where the metal film 8 is deposited on the lower surface of the stage 1, as shown in FIG. 3. A metal film 21 of a light element such as aluminum may be deposited on the outer surface of the metal film 20 of the heavy element to absorb the electrons reflected from the magnetic pole piece of the objective lens.

Referring next to FIG. 4, the portion 9 of the specimen stage 1 which is close to the specimen is made of a light element. The remaining portion 10 is made of a heavy element. Also in this case, the X-rays from the objective lens pole piece are prevented from penetrating through the specimen stage.

Referring next to FIG. 5, a specimen stage 12 made of a light element is provided with a hole. A material 11 of a heavy element is inserted in this hole in such a way that the heavy-element material 11 is enclosed in the specimen stage 12 of the light element.

Referring to FIG. 6, there is shown the main portion of another electron microscope according to the invention. The main portion, or the specimen insertion device, of the microscope inserts a specimen from a direction perpendicular to the optical axis Z. This device is similar to the specimen insertion device already described in conjunction with FIG. 1(A) and FIG. 1(B), except for the following points. A specimen stage 13 is made of a light element such as beryllium. The stage 13 is provided with a threaded recess for placement of a specimen 3. This specimen 3 is attached to the specimen stage 13 via a washer 14 by a cap screw 16. A film 15 of a heavy element is deposited on the lower surface of the washer 14. The cap screw 16 is made of a light element such as beryllium.

In the electron microscope of the construction as described above, when the electron beam emitted from the electron gun (not shown) is made to hit the specimen 3, X-rays are produced from the specimen and detected by the X-ray detector 6.

The electrons transmitted through the specimen 3 are scattered, and some of them collide against the lower magnetic pole piece 5. X-rays are emitted from this lower magnetic pole piece 5 and fall on the specimen stage 13 made of the light element. Since the metal film 8 of the heavy element is deposited on the upper surface of the stage 13, the X-rays released from the pole piece 5 are absorbed by the metal film 8. The X-rays emitted from the lower magnetic pole piece 5 toward the specimen are absorbed by the metal film 15 of the heavy element deposited on the lower surface of the washer 14. Consequently, the X-rays produced from the lower magnetic pole piece 5 are not detected by the X-ray detector 6, which detects only the X-rays emitted from the specimen. The washer 14 can consist only of the heavy element.

In the specimen stage shown in FIG. 2, the portion close to the specimen is made of a light element, while the remaining portion is made of a heavy element. A washer on which a film of a metal of a heavy element is deposited may be used to attach the specimen to the specimen stage.

Figure 7:
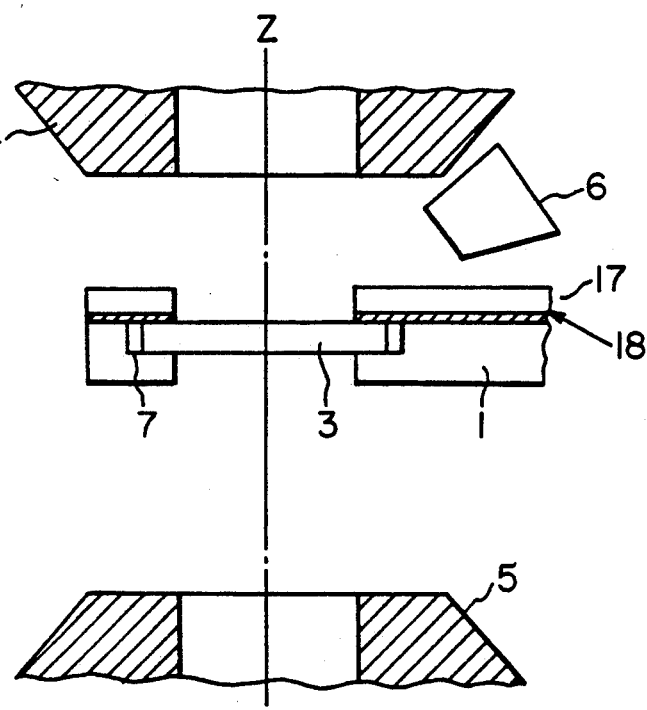
FIG. 7 is a vertical cross section of the main portion of a still further electron microscope according to the invention.

Referring next to FIG. 7, there is shown the main portion of a further electron microscope according to the invention. The main portion, or the specimen insertion device, inserts a specimen from a direction perpendicular to the optical axis Z. This device is similar to the specimen insertion device previously described in connection with FIG. 1 except that a cover 17 made of a light element, such as beryllium, holds down the specimen and that a film 18 of a heavy element, such as gold, is deposited on the lower surface of the cover 17.

In the electron microscope constructed as described above, the electrons transmitted through the specimen 3 are scattered, and some of them collide against the lower magnetic pole piece 5. X-rays are emitted from this pole piece 5 and penetrate through the specimen stage 1 made of the light element. Since the metal film 18 of the heavy element is deposited on the lower surface of the cover 17, the X-rays released from the lower magnetic pole piece 5 are absorbed by the metal film 18 of the heavy element. Therefore, these X-rays from the pole piece 5 are not detected by the X-ray detector 6, which detects only the X-rays from the specimen 3.

In the description made above, the metal film 18 of the heavy element is deposited on the lower surface of the cover 17. The same advantage can be had by forming the metal film 18 on the upper surface of the cover 17. In this case, if a metal film of a light element is deposited on the upper surface of the metal film 18 of the heavy element, then generation of X-rays due to collision of reflected electrons and other electrons is prevented. The same advantages can be derived where the portion of the cover 17 close to the specimen is made of a light element, and the remaining portion is made of a heavy element.

In the cover 17, the material of the heavy metal may be enclosed in the material of the light element. The cover which prevents the X-rays from penetrating through the specimen stage may be fabricated independent of the specimen stage. This cover may be mounted to the lower surface of the specimen stage 1.

In the above-described embodiments, the light element can also be carbon or boron.

In accordance with the present invention, while primary electrons are penetrating through the specimen, detection of X-rays emitted from the lower magnetic pole piece bombarded by scattered electrons can be prevented. The X-ray detector detects only the X-rays emitted from the specimen. As a result, accurate X-ray analysis of the specimen can be performed.

As used in the specification and claims "light elements" refers to elements having an atomic weight preferably less than 30. As used in the specification and claims, "heavy elements" refers to elements having an atomic weight greater than 90 and preferably greater than 175.

Having thus described our invention with the detail and particularity required by the Patent Laws, what is claimed to be protected by Letters Patent is set forth in the following claims.

What is claimed is:

1. An electron microscope comprising:
an objective lens consisting of an upper magnetic pole piece and a lower magnetic pole piece;
a specimen stage which is disposed between the upper and lower magnetic pole pieces and on which a specimen is placed, the stage being composed of plural abutting layers, one of the layers consisting of a heavy element, another layer consisting of a light element;
means for directing an electron beam to the specimen to emit X-rays from the specimen; and
a detection means for detecting the X-rays emitted from the specimen;

2. The electron microscope of claim 1, wherein the uppermost one of said plural layers of said specimen stage consists of a heavy element, and wherein the portion of this uppermost layer which is irradiated with said electron beam contains no heavy element.

3. An electron microscope comprising:
an objective lens consisting of an upper magnetic pole piece and a lower magnetic pole piece;
a specimen stage which is disposed between the upper and lower magnetic pole pieces and on which a specimen is placed;
means for directing an electron beam to the specimen to emit X-rays from the specimen, the portion of the specimen stage that is irradiated with the electron beam consisting of a light element, the remaining portion of the stage consisting of a heavy element; and
a detection means for detecting the X-rays emitted from the specimen.

4. An electron microscope comprising:
an objective lens consisting of an upper magnetic pole piece and a lower magnetic pole piece;
a specimen stage which is disposed between the upper and lower magnetic pole pieces and on which a specimen is placed;
means for directing an electron beam to the specimen to emit X-rays from the specimen;
an attaching means for attaching the specimen to the specimen stage via a spacer having an open portion at the center thereof for exposing the specimen beam while contacting edges of the specimen, the portion of the spacer that is in contact with the specimen consisting of a heavy element; and
a detection means for detecting the X-rays emitted from the specimen.

5. An electron microscope comprising:
an objective lens consisting of an upper magnetic pole piece and a lower magnetic pole piece;
a specimen stage which is disposed between the upper and lower magnetic pole pieces and on which a specimen is placed;
a covering on the surface of the specimen stage composed of plural layers, one of the layers consisting of a heavy element, another layer consisting of a light element;
means for directing an electron beam to the specimen to emit X-rays from the specimen; and
a detection means for detecting the X-rays emitted from the specimen.

6. The electron microscope of claim 5, wherein the uppermost one of said plural layers of said covering consists of a heavy element, and wherein the portion of this covering which is irradiated with said electron beam contains no heavy element.

7. An electron microscope comprising:
an objective lens consisting of an upper magnetic pole piece and a lower magnetic pole piece;
a specimen stage which is disposed between the upper and lower magnetic pole pieces and on which a specimen is placed;
means for directing an electron beam to the specimen to emit X-rays from the specimen;
a covering on the surface of the specimen stage except for the portion irradiated with the electron beam, the covering consisting of a heavy element; and
a detection means for detecting the X-rays emitted from the specimen.

* * * * *